(12) United States Patent
Buehler

(10) Patent No.: US 9,542,636 B2
(45) Date of Patent: *Jan. 10, 2017

(54) RFID CHIP MODULE

(71) Applicant: Textilma AG, Stansstaad (CH)

(72) Inventor: Stephan Buehler, Daenikon (CH)

(73) Assignee: Textilma AG, Stansstaad (CH)

( * ) Notice: Subject to any disclaimer, the term of this patent is extended or adjusted under 35 U.S.C. 154(b) by 0 days.

This patent is subject to a terminal disclaimer.

(21) Appl. No.: 14/726,878

(22) Filed: Jun. 1, 2015

(65) Prior Publication Data

US 2015/0262053 A1 Sep. 17, 2015

Related U.S. Application Data

(63) Continuation of application No. 14/240,175, filed as application No. PCT/EP2012/065433 on Aug. 7, 2012, now Pat. No. 9,208,426.

(30) Foreign Application Priority Data

Aug. 25, 2011 (EP) .................................... 11178848

(51) Int. Cl.
| | | |
|---|---|---|
| G06K 19/077 | (2006.01) | |
| H01L 23/48 | (2006.01) | |
| H01L 23/50 | (2006.01) | |
| H01L 23/00 | (2006.01) | |
| H01L 23/498 | (2006.01) | |
| H01L 23/66 | (2006.01) | |

(Continued)

(52) U.S. Cl.
CPC ... *G06K 19/07758* (2013.01); *G06K 19/07749* (2013.01); *G06K 19/07752* (2013.01);

(Continued)

(58) Field of Classification Search
CPC ................... G06K 19/07752; G06K 19/07749; G06K 19/07758; G06K 19/07754; H01L 23/481; H01L 23/50; H01L 24/81; H01L 23/66; H01L 23/49838
See application file for complete search history.

(56) References Cited

U.S. PATENT DOCUMENTS 6,117,706 A 9/2000 Yoshioka et al.
7,253,735 B2 * 8/2007 Gengel ............ G06K 19/07749
235/492

(Continued)

FOREIGN PATENT DOCUMENTS

CN 102129599 A 7/2011
JP H087065 A 1/1996

(Continued)

OTHER PUBLICATIONS

Japanese Office Action Notification of Reasons for Refusal corresponding to application No. 2014-526438, Mailed Feb. 13, 2015.

(Continued)

*Primary Examiner* — William Coleman
(74) *Attorney, Agent, or Firm* — Maginot, Moore & Beck, LLP

(57) ABSTRACT

A chip module comprises a carrier, having a first main surface and a second main surface opposite to the first main surface. A first recess structure is arranged in the carrier in the first main surface, and a chip is arranged in the first recess structure of the carrier. A patterned metallization layer is deposited on the second main surface of the carrier, the metallization layer having a first metallization structure and a second metallization structure, the first metallization structure being electrically isolated from the second metallization structure. The chip is electrically connected to the first metallization structure and the second metallization structure. The chip module comprises in particular an RFID chip and is suited to be connected to a textile substrate by way of laser reflow soldering.

13 Claims, 3 Drawing Sheets

(52) U.S. Cl.
CPC ...... *G06K 19/07754* (2013.01); *H01L 23/481* (2013.01); *H01L 23/49838* (2013.01); *H01L 23/50* (2013.01); *H01L 23/66* (2013.01); *H01L 24/81* (2013.01); *H01L 2223/6616* (2013.01); *H01L 2223/6677* (2013.01); *H01L 2224/16238* (2013.01); *H01L 2224/32245* (2013.01); *H01L 2224/8112* (2013.01); *H01L 2224/81815* (2013.01); *H01L 2924/12042* (2013.01); *H01L 2924/401* (2013.01)

(56) References Cited

U.S. PATENT DOCUMENTS 9,208,426 B2 * 12/2015 Buehler ........... G06K 19/07749
2009/0315320 A1   12/2009 Finn

FOREIGN PATENT DOCUMENTS

| JP | H11102992 A | 4/1999 |
|----|-------------|--------|
| JP | 2007257126 A | 10/2007 |
| JP | 2009140087 A | 6/2009 |
| KR | 20020011414 A | 2/2002 |
| WO | WO0070676 A1 | 11/2000 |

OTHER PUBLICATIONS

Korean Office Action Notice of Grounds for Rejection corresponding to application No. 10-2014-7005852, mailed Apr. 23, 2015.
Chinese Office Action corresponding to application No. 201280041390.6, mailed Nov. 20, 2015.
Korean Office Action corresponding to application No. 10-2014-7005852, mailed Oct. 29, 2015.

* cited by examiner

RFID CHIP MODULE

The invention pertains to chip modules, particularly to RFID chip modules for connecting to textile substrates. The invention pertains further to a label having an RFID chip module and to a method of manufacturing a label having an RFID chip module.

BACKGROUND

RFID chips have become increasingly useful for labelling textiles, for example clothing or other products made from textiles. In order to ensure their proper functionality RFID labels have to be provided with an RFID transponder chip and a corresponding antenna structure for sending and receiving electrical RFID signals. RFID labels may be manufactured by using an RFID chip and connecting the RFID chip to an electrically conductive strip in a substrate, such as a textile substrate having a metal strip glued to or woven therein.

Since RFID labels are a mass product there is a need for efficiently and reliably manufacturing RFID labels with a high throughput.

SUMMARY

An idea of the present invention is to provide a chip module, particularly an RFID chip module, for connecting to a substrate having an antenna structure, for example a textile substrate with a metallization structure forming an RFID antenna. In order to reliably and efficiently connect the chip module to the substrate, the chip module is provided with a metallization structure on the bottom side, which may be soldered to the metallization structure of the substrate. The soldering may be performed by a laser reflow soldering process, wherein the chip module is irradiated on the surface opposite to the surface with the metallization structure by one or more laser beams, which are guided through the main body of the chip module towards the metallization structure. The energy of the laser beams may be deposited mainly at the metallization structure in order to reflow soldering material arranged on the metallization structure, thus forming a solder connection between the chip module and the substrate.

An aspect of the present invention therefore relates to a chip module which comprises a carrier, having a first main surface and a second main surface opposite to the first main surface, a first recess structure arranged in the carrier in the first main surface, and a chip arranged in the first recess structure of the carrier. A patterned metallization layer is deposited on the second main surface of the carrier, the metallization layer having a first metallization structure and a second metallization structure, the first metallization structure being electrically isolated from the second metallization structure. The chip is electrically connected to the first metallization structure and the second metallization structure.

With this chip module a fast, efficient and reliable laser reflow soldering process may be used when soldering the chip module to a substrate. One of several advantages consists in the chip module being configured to guide energy from laser beams hitting the first main surface through the carrier to the metallization structure, where a soldering process may be performed. The possibility of laser reflow soldering through the main body of the chip module increases the processing speed and efficiency.

According to one embodiment the carrier may comprise a material which is transparent to visible, UV, and/or infrared light. This provides the advantage that the energy of laser beams used for laser reflow soldering are not or not substantially absorbed in the carrier material, thus providing for a faster reflow process.

According to another embodiment the chip module may comprise a second recess structure arranged in the carrier in the first main surface opposite to the first metallization structure, and a third recess structure arranged in the carrier in the first main surface opposite to the second metallization structure. The additional recess structures provide the advantage that the thickness of the carrier is lower in the areas where a laser beam is guided through the carrier of the chip module.

Advantageously, the second and the third recess structures may be vias which extend from the first main surface to the second main surface through the carrier. This allows for a direct energy transfer of the laser beams to the metallization structure on the surface of the carrier, when laser beams are guided through the vias.

In an embodiment, the vias may extend through the first and the second metallization structures. In this case, the energy of the laser beams is directly transferred through the chip module to solder material which may be deposited on the metallization structure of the chip module.

In an embodiment, the first and second metallization structures are each patterned with a continuous metallization member extending over edge portions of the chip module on the second main surface and with a metallization land extending from the continuous metallization member towards a centre portion of the chip module.

In yet another embodiment, a photoresist layer may be arranged between the metallization layer and the carrier. The photoresist layer may allow for an efficient energy absorption of laser beams in the metallization structure when laser reflow soldering of the chip module to a substrate.

In yet another embodiment, the chip in the recess structure may be molded with a mold material. This seals off the chip within the chip module and provides additional stability and resistance with regard to extraneous causes potentially endangering the integrity or functionality of the chip module.

In another embodiment, the chip may be an RFID chip. This allows for the efficient and inexpensive manufacturing of RFID chip modules, in particular for RFID labels.

In yet another embodiment, the chip module may comprise a first solder bump arranged on the first metallization structure, and a second solder bump arranged on the second metallization structure. The solder bumps may preferably be arranged on the metallization structure prior to laser soldering the chip module to a substrate, in order to speed up the soldering process.

Another aspect of the present invention relates to a method of connecting a chip module to a substrate, the chip module comprising a carrier, having a first main surface and a second main surface opposite to the first main surface and a patterned metallization layer deposited on the second main surface of the carrier, the metallization layer having a first metallization structure with a first solder bump attached thereto and a second metallization structure with a second solder bump attached thereto. The method comprises placing the chip module on a substrate, the second main surface of the chip module facing the substrate, aligning the first solder bump and the second solder bump of the chip module with corresponding first and second metallization patterns on the substrate, irradiating the chip module with laser beams, the laser beams hitting the first main surface at a right incidence angle, and reflowing the first and the second solder bumps by the laser beams, thereby forming a solder connection between the first and the second solder bumps and the corresponding first and second metallization patterns on the substrate. The inventive method has the advantage that the laser reflow processing allows for efficient and fast soldering of chip modules to substrates.

According to an embodiment the method may further comprise stenciling the chip module from a tape, the tape comprising a plurality of chip modules. With this method, the throughput of the manufacturing process can be thoroughly enhanced.

In an embodiment, the chip module may comprise an RFID chip and the first and second metallization patterns of the substrate may form an RFID antenna structure. This allows for a fast and efficient processing of an RFID transponder, where an antenna structure of the substrate has to be electrically conductively connected to electrical terminals of an RFID chip.

Yet another aspect of the present invention relates to an RFID label having a chip module according to the invention and a substrate having an RFID antenna structure, the chip module being soldered to the RFID antenna structure. The substrate may in particular be a textile substrate.

Further modifications and variations are featured in the dependent claims.

BRIEF DESCRIPTION OF THE DRAWINGS

The accompanying drawings are included to provide a further understanding of the present invention. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily drawn to scale relative to each other. Like reference numerals designate corresponding similar parts, unless noted otherwise.

Several embodiments of the present invention will be described in more detail with reference to the accompanying drawings in which.

Although specific embodiments have been illustrated and described herein, it will be appreciated by those of ordinary skill in the art that a variety of alternate and/or equivalent implementations may be substituted for the specific embodiments shown and described without departing from the scope and spirit of the present invention. Generally, this application is intended to cover any adaptations or variations of the specific embodiments discussed herein. In particular, specific features, characteristics and properties of different embodiments as discussed hereinbelow may be combined, if not explicitly indicated otherwise.

DETAILED DESCRIPTION

Figure 1:
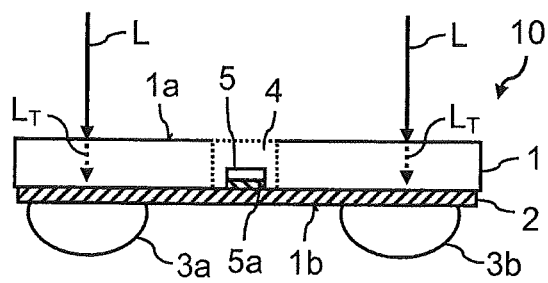
FIG. 1 shows a schematical illustration of a chip module according to one embodiment of the invention.

FIG. 1 shows a schematical illustration of a chip module 10. The chip module 10 may comprise a carrier 1 having a first main surface 1a, denoted hereinforth as top surface, and a second main surface 1b, denoted hereinforth as bottom surface, the bottom surface 1b being opposite to the top surface 1a. The carrier 1 may comprise an electrically isolating material. The carrier 1 may comprise for example a semiconductor material or alternatively a fibreglass reinforced epoxy material, such as FR4. It may be possible for the carrier 1 to comprise a flexible circuit material, such as for example polyester, polyimide, polyetherimide or polyethylene naphthalate. The chip module 10 may further comprise a metallization layer 2 being arranged on the bottom surface 1b. The metallization layer 2 may be deposited on the bottom surface 1b of the carrier 1 by conventional depositing means, for example by galvanic deposition, electroplating, physical vapour deposition (PVD), chemical vapour deposition (CVD), sputtering or similar deposition techniques. The metallization layer 2 may also be a metal sheet bonded to the carrier 1. The metallization layer 2 may for example comprise a copper layer or copper sheet. The metallization layer 2 may be coated with silver or gold in order to reduce oxidation effects on the surface of the metallization layer 2.

The chip module 10 may further comprise a first recess structure 4, which is arranged in the carrier 1 from the top surface 1a. The first recess structure 4 may for example be arranged substantially in the centre portion of the chip module 10. The first recess structure 4 may have any desired shape and size. In particular, the first recess structure 4 may be dimensioned to house a chip 5 within the first recess structure 4. The chip 5 may for example be an RFID chip. The chip 5 may be arranged in the first recess structure 4. In one embodiment, the first recess structure 4 may be recessed into the carrier material to a predetermined depth that does not exceed the total depth of the carrier 1. In this case, the chip 5 may be directly adhered to the bottom of the first recess structure 4. In one embodiment, the first recess structure 4 may be arranged in the carrier material so as to form a throughhole through the carrier 1. In this case, the chip 5 may be coupled to the metallization layer 2 by means of an electrically isolating adhesive layer 5a.

The chip module 10 may further comprise electrically conductive connecting material, in particular solder material, arranged on the metallization layer 2. The electrically conductive connecting material may for example be deposited as solder bumps 3a, 3b. In FIG. 1 two solder bumps 3a, 3b are exemplarily shown, however, any other numbers of solder bumps are equally possible. The solder bumps 3a, 3b may be arranged in edge portions of the chip module 10. In particular, the solder bumps 3a, 3b may be arranged in an area of the chip module 10 which is not situated below the centre portion, where the chip 5 is arranged in the first recess structure 4. It is also possible to use other connecting material instead of solder material, for example electrically conductive glue, which may form connection bumps similar to the solder bumps 3a, 3b.

In order to solder the chip module 10 to a substrate (not shown), laser beams L may be used to irradiate the chip module 10. The laser beams L may be directed in a right or substantially right incidence angle towards the top surface 1a of the carrier 1. The energy of the laser beams L may be transferred through the main body of the carrier 1 towards the metallization layer 2. The chip module 10 may be irradiated at areas of the top surface 1a which lie directly opposite of the area on the bottom surface 1b where the solder bumps 3a, 3b are deposited. In that way, the energy of the laser beams L is transferred through the carrier 1 and heats up the metallization layer 2 and the solder bumps 3a, 3b, thereby reflowing the solder or connecting material. The reflown solder material may be used to solder the chip module 10 to a substrate below the solder bumps 3a, 3b.

Figure 2A:
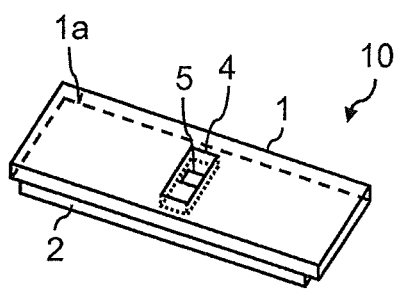
FIG. 2A shows a schematical illustration of the chip module of FIG. 1 in isometric view according to a further embodiment of the invention.
Figure 2B:
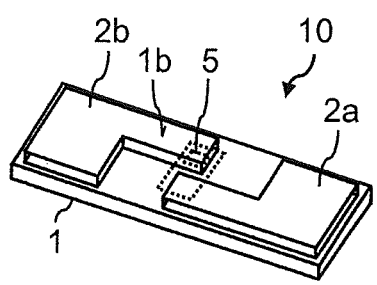
FIG. 2B shows a schematical illustration of the chip module of FIG. 1 in isometric view according to a further embodiment of the invention.

FIGS. 2A and 2B show schematical illustrations of the chip module 10 of FIG. 1 in isometric view according to a further embodiment of the invention. FIG. 2A shows an isometric view on the top surface 1a of the chip module 10, whereas FIG. 2B shows an isometric view on the bottom surface 1a of the chip module 10.

The metallization layer 2 may be patterned to form first and second metallization structures 2a and 2b, as exemplarily depicted in FIG. 2B. The first and second metallization structures 2a and 2b may be patterned to be electrically isolated from each other. The first and second metallization structures 2a and 2b may for example be patterned with a continuous metallization member extending over an edge portion of the chip module 10 on the bottom surface 1b and with a metallization land extending from the continuous metallization member towards the centre portion of the chip module 10. The metallization lands of each of the first and second metallization structures 2a and 2b may be arranged on opposite sides of the chip module 10. It should be noted, that the shape and dimensions of the first and second metallization structures 2a and 2b in FIGS. 2A and 2B are only exemplary, and that any other shape, size and structure of the first and second metallization structures 2a and 2b may equally be possible.

The chip 5 within the first recess structure 4 may be electrically connected to the first and second metallization structures 2a and 2b. The electrical connection may for example be established by wire bonds (not shown) extending from terminals of the chip 5 to each of the first and second metallization structures 2a and 2b. For example, a first wire bond may be connected to a first terminal of the chip 5 and to a metallization land of the first metallization structures 2a. A second wire bond may be connected to a second terminal of the chip 5 and to a metallization land of the second metallization structures 2b.

An additional layer (not shown) may be provided between the metallization layer 2 and the carrier 1. For example, a photoresist layer may be provided between the metallization layer 2 and the carrier 1. The carrier 1 may comprise a material which is substantially transparent to visible, UV, and/or infrared light. In particular, the carrier 1 may comprise a material which has a high transmission coefficient or transmittance for laser beams L guided through the carrier 1. The laser beams L may be transmitted substantially without energy loss as laser beams $L_T$ through the carrier 1. The photoresist layer may then comprise a material which has a low transmittance, that is, a high absorbance for the laser beams $L_T$. Laser beams L that are used to irradiate the chip module 10 in order to perform a laser reflow soldering process for the solder bumps 3 are able to heat up the solder bumps 3 more quickly, since most of the laser energy is transmitted through the carrier 1 and deposited in the photoresist layer near the metallization layer 2 and the solder bumps 3.

Figure 3:
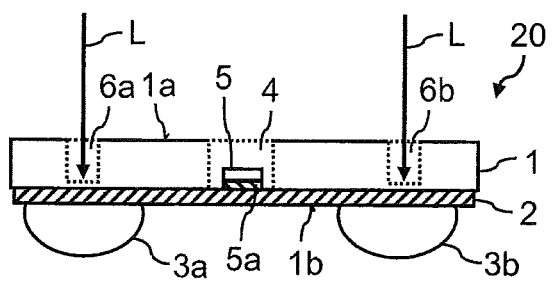
FIG. 3 shows a schematical illustration of a chip module according to another embodiment of the invention.

FIG. 3 shows a schematical illustration of a chip module 20. The chip module 20 differs from the chip module 10 in that additional recess structures 6a, 6b are formed in the carrier 1. A second recess structure 6a is formed in an edge portion of the carrier 1 from the top surface 1a towards the bottom surface 1b. A third recess structure 6b is formed in an edge portion of the carrier 1 opposite to the edge portion where the second recess structure 6a is formed from the top surface 1a towards the bottom surface 1b. The recess structures 6a, 6b may be formed to a depth which is lower than the thickness of the carrier 1. Alternatively, the recess structures 6a, 6b may be formed as vias through the main body of the carrier 1, that is, the vias extend through the whole thickness of the carrier 1. The bottom of the recess structures 6a, 6b may be coated with a photoresist in order to increase the absorbance of laser beams L guided through the recess structures 6a, 6b.

Figure 4:
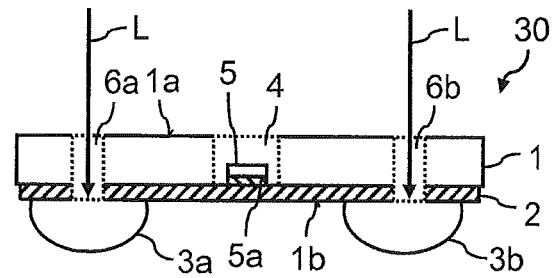
FIG. 4 shows a schematical illustration of a chip module according to yet another embodiment of the invention.

FIG. 4 shows a schematical illustration of a chip module 30. The chip module 30 differs from the chip module 20 in that the additional recess structures 6a, 6b are formed as vias through the carrier 1 and through the metallization layer 2. In other words, the recess structures 6a, 6b extend from the top surface is of the carrier 1 through the whole thickness of the carrier 1 and through the whole thickness of the metallization layer 2 to the bottom surface 1b of the chip module 30. Solder bumps 3a, 3b deposited on the metallization layer 2 may preferably be arranged on the bottom surface 1b over the exits of the vias formed by the recess, structures 6a, 6b, respectively.

Figure 5:
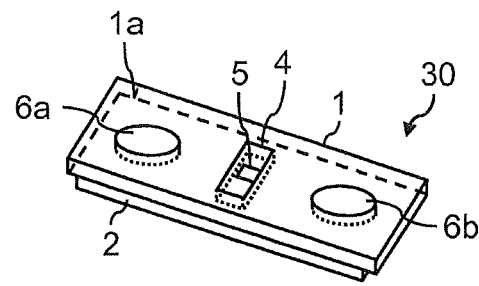
FIG. 5 shows a schematical illustration of the chip module of FIG. 4 in isometric view according to a further embodiment of the invention.

The second and third recess structures 6a, 6b may have any shape and size. For example, as schematically shown in FIG. 5, which shows an isometric view of the chip module 30 in FIG. 4, the second and third recess structures 6a, 6b may have a circular shape and are formed as cylindrical tubes extending through the carrier 1 and/or the metallization layer 2.

Figure 6:
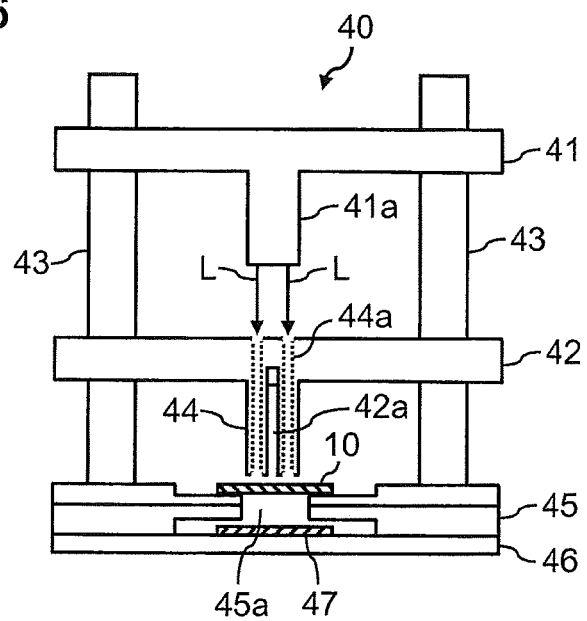
FIG. 6 shows a schematical illustration of a manufacturing apparatus for connecting chip modules to a substrate according to yet another embodiment of the invention.

FIG. 6 shows a schematical illustration of a manufacturing apparatus 40 for connecting chip modules to a substrate 47. Exemplarily, a chip module 10 is shown in FIG. 6, however, any other chip module 10, 20 or 30 as detailed above, may be used as well. The manufacturing apparatus 40 may comprise a laser device 41 having an active laser portion 41a, a stencilling device 42, a stencilling mask 45 and a base plate 46. The laser device 41 and the stencilling device 42 may be aligned with respect to each other by means of a guiding housing 43. The stencilling device 42 may comprise a stencil head 44. The stencil head 44 may comprise a plurality of hollow structures 44a, through which laser beams L from the active laser portion 41a may be guided towards the chip module 10.

The chip modules 10 may be provided as a tape comprising a plurality of chip modules 10 connected adjacently to each other. For example, the tape may comprise a number of parallel rows of chip modules 10 and the tape may be guided through the stencilling mask 45 during the operation of the manufacturing apparatus 40.

The operation of the manufacturing apparatus will be explained in conjunction with the method 50 schematically illustrated in FIG. 7. The method 50 comprises in a first step 51 placing a chip module on a substrate 47. This may be done by stencilling the chip module from a tape, the tape comprising a plurality of chip modules. Any of the chip modules 10, 20 or 30 a shown above in conjunction with FIGS. 1 to 5 may be used in the method 50 of FIG. 7.

The chip module may be arranged in the stencilling mask 45 such that the second main surface 1b of the chip module faces the substrate 47. The substrate 47 may for example be a textile substrate 47 having a metallization structure arranged thereon. The metallization structure may for example be an RFID antenna structure. The stencilling head 44 may be brought down along the guiding housing 43 in order to stencil the chip module 10 from the tape with chip modules 10. The chip module 10 cut out from the tape may be held against the stencilling head 44 by means of underpressure applied through a channel 42a within the stencilling head 44.

The chip module 10 may in a second step 52 be aligned by aligning the first solder bump 3a and the second solder bump 3b of the chip module 10 with corresponding first and second metallization patterns on the substrate 47. In a third step 53, the chip module 10 may be irradiated with laser beams L, the laser beams L being guided through the hollow structures 44a of the stencilling head 44 and thus hitting the first main surface 1a at a right or substantially right incidence angle. The laser device 41 may be controlled to apply one or more laser pulses to the chip module 10, wherein the energy of the laser pulses is controlled to reflowing the first and the second solder bumps in a fourth step 54. Thereby a solder connection between the first and the second solder bumps 3a, 3b and the corresponding first and second metallization patterns on the substrate 47 may be formed.

A system for connecting a chip module to a substrate, may comprise means for placing the chip module on a substrate, the second main surface of the chip module facing the substrate, means for aligning the first solder bump and the second solder bump of the chip module with corresponding first and second metallization patterns on the substrate, means for irradiating the chip module with laser beams, the laser beams hitting the first main surface at a right incidence angle, and means reflowing the first and the second solder bumps by the laser beams, thereby forming a solder connection between the first and the second solder bumps and the corresponding first and second metallization patterns on the substrate.

Figure 7:
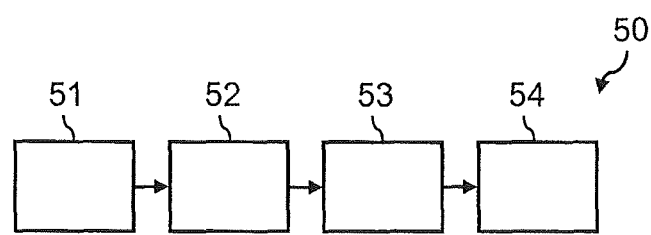
FIG. 7 shows a schematical illustration of a method of connecting chip modules to a substrate according to yet another embodiment of the invention.
Figure 8:
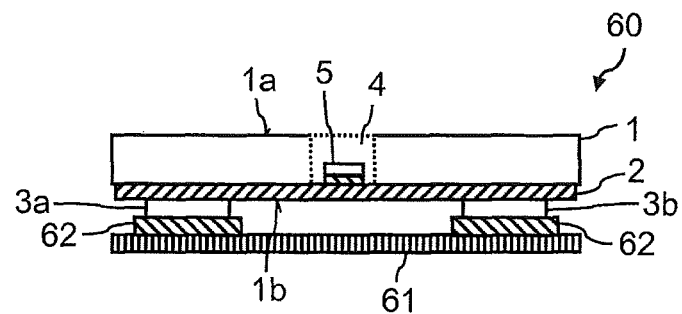
FIG. 8 shows a schematical illustration of an RFID label according to yet another embodiment of the invention.

FIG. 8 shows a schematical illustration of an RFID label 60 manufactured for example by using a method 50 in a manufacturing apparatus 40 as shown in FIGS. 6 and 7. The RFID label 60 is formed by a chip module 10, 20 or 30, as detailed in conjunction with FIGS. 1 to 5, which is soldered to metallization patterns 62 on the surface of a substrate 62. The substrate 62 may for example be the same substrate as substrate 47, particularly a textile substrate. The metallization patterns 62 may form an RFID antenna structure serving as an RFID antenna for the RFID chip 5 arranged in the recess structure 4 of the carrier 1. The soldering connection is procured by the reflown soldering bumps 3a and 3b, respectively, which are shown as substantially flat structures in FIG. 8.

Particular features of an embodiment of the invention may have been disclosed with respect to only one of several implementations, however, said feature may be combined with one or more other features of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two components work together or interact with each other, irrespective of whether they are in direct physical or electrical contact or not. Additionally, any terminology used in the foregoing description related to the spatial arrangement of features, elements or components of the embodiments depicted in the drawings, such as "top", "bottom", "left", "right", "lower", "upper" and similar terms, is used solely for purposes of an easier understanding and is not intended to limit the invention in any way.

The invention claimed is:

1. A chip module, comprising:
a carrier, having a first main surface and a second main surface opposite to the first main surface;
a first recess structure arranged in the carrier in the first main surface;
a chip arranged in the first recess structure of the carrier; and
a patterned metallization layer deposited on the second main surface of the carrier, the metallization layer having a first metallization structure and a second metallization structure, the first metallization structure being electrically isolated from the second metallization structure, and the first and second metallization structures including metallization members extending over edge portions of the chip module on the second main surface,
wherein the chip is electrically connected to the first metallization structure and the second metallization structure,
wherein the chip module further includes:
a second recess structure arranged in the carrier in the first main surface opposite to the first metallization structure; and
a third recess structure arranged in the carrier in the first main surface opposite to the second metallization structure,
wherein the second and the third recess structures are vias which extend from the first main surface to the second main surface through the carrier.

2. The chip module according to claim 1, wherein the carrier includes a material which is transparent to visible, UV, and/or infrared light.

3. The chip module according to claim 1, wherein the vias extend through the first and the second metallization structures.

4. The chip module according to claim 1, wherein the first and second metallization structures are each patterned with a continuous metallization member extending over edge portions of the chip module on the second main surface and with a metallization land extending from the continuous metallization member towards a centre portion of the chip module.

5. The chip module according to claim 1, further comprising:
a photoresist layer being arranged between the metallization layer and the carrier.

6. The chip module according to claim 1, wherein the chip in the recess structure is molded with a mold material.

7. The chip module according to claim 1, wherein the chip is an RFID chip.

8. The chip module according to claim 1, further comprising:
- a first solder bump arranged on the first metallization structure; and
- a second solder bump arranged on the second metallization structure.

9. A method of connecting a chip module to a substrate, the chip module to a substrate, the chip module comprising a carrier, having a first main surface and a second main surface opposite to the first main surface and a patterned metallization layer deposited on the second main surface of the carrier, the metallization layer having a first metallization structure with a first solder bump attached thereto and a second metallization structure with a second solder bump attached thereto, and the first and second metallization structures comprising metallization members extending over edge portions of the chip module on the second main surface, the carrier having a second recess structure arranged in the carrier in the first main surface opposite to the first metallization structure and a third recess structure arranged in the carrier in the first main surface opposite to the second metallization structure, wherein the second and the third recess structures are vias which extend from the first main surface to the second main surface through the carrier, the method comprising:
- placing the chip module on a substrate, the second main surface of the chip module facing the substrate;
- aligning the first solder bump and the second solder bump of the chip module with corresponding first and second metallization patterns on the substrate;
- irradiating the chip module with laser beams, the laser beams hitting the first main surface at a right incidence angle; and
- reflowing the first and the second solder bumps by the laser beams, thereby forming a solder connection between the first and the second solder bumps and the corresponding first and second metallization patterns on the substrate.

10. The method according to claim 9, further comprising stenciling the chip module from a tape, the tape comprising a plurality of chip modules.

11. The method according to claim 9, wherein the chip module includes an RFID chip and wherein the first and second metallization patterns of the substrate form an RFID antenna structure.

12. A RFID label, comprising:
an RFID chip module including:
- a carrier, having a first main surface and a second main surface opposite to the first main surface;
- a first recess structure arranged in the carrier in the first main surface;
- a chip arranged in the first recess structure of the carrier; and
- a patterned metallization layer deposited on the second main surface of the carrier, the metallization layer having a first metallization structure and a second metallization structure, the first metallization structure being electrically isolated from the second metallization structure, and the first and second metallization structures comprising metallization members extending over edge portions of the chip module on the second main surface,
wherein the chip is electrically connected to the first metallization structure and the second metallization structure,
wherein the chip module further includes:
- a second recess structure arranged in the carrier in the first main surface opposite to the first metallization structure; and
- a third recess structure arranged in the carrier in the first main surface opposite to the second metallization structure,
wherein the second and the third recess structures are vias which extend from the first main surface to the second main surface through the carrier; and
a substrate having an RFID antenna structure, the RFID chip module being soldered to the RFID antenna structure.

13. The RFID label according to claim 12, wherein the substrate is a textile substrate.

* * * * *